(12) United States Patent
Kouketsu et al.

(10) Patent No.: US 9,822,225 B2
(45) Date of Patent: Nov. 21, 2017

(54) FLUORORESIN FILM HAVING EXCELLENT TRANSPARENCY

(71) Applicant: DAIKIN INDUSTRIES, LTD., Osaka-Shi, Osaka (JP)

(72) Inventors: Yasuko Kouketsu, Settsu (JP); Ryouichi Fukagawa, Settsu (JP); Tatsuya Higuchi, Settsu (JP); Takeshi Shimono, Settsu (JP); Takashi Sekiguchi, Settsu (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 291 days.

(21) Appl. No.: 14/431,538

(22) PCT Filed: Dec. 18, 2013

(86) PCT No.: PCT/JP2013/083969
§ 371 (c)(1),
(2) Date: Mar. 26, 2015

(87) PCT Pub. No.: WO2014/103845
PCT Pub. Date: Jul. 3, 2014

(65) Prior Publication Data
US 2015/0252156 A1  Sep. 10, 2015

(30) Foreign Application Priority Data

Dec. 25, 2012 (JP) .................................. 2012-281413

(51) Int. Cl.
| | | |
|---|---|---|
| *C08J 5/18* | (2006.01) | |
| *B29C 47/00* | (2006.01) | |
| *H01L 31/048* | (2014.01) | |
| *B29C 47/88* | (2006.01) | |
| *B29C 47/32* | (2006.01) | |
| *B29K 27/12* | (2006.01) | |
| *B29L 7/00* | (2006.01) | |

(52) U.S. Cl.
CPC ............ *C08J 5/18* (2013.01); *B29C 47/0021* (2013.01); *B29C 47/0076* (2013.01); *B29C 47/32* (2013.01); *B29C 47/88* (2013.01); *B29C 47/886* (2013.01); *B29C 47/8875* (2013.01); *H01L 31/0481* (2013.01); *B29C 47/887* (2013.01); *B29C 47/8845* (2013.01); *B29K 2027/12* (2013.01); *B29L 2007/00* (2013.01); *C08J 2327/18* (2013.01); *Y02E 10/50* (2013.01)

(58) Field of Classification Search
CPC . B29C 47/0021; B29C 47/0076; B29C 47/32; B29C 47/88; B29C 47/886; B29C 47/8875; B29C 47/8845; B29C 47/887; C08J 5/18; C08J 2327/18; H01L 31/0481; B29K 2027/12; B29L 2007/00; Y02E 10/50

USPC .......................................................... 526/253
See application file for complete search history.

(56) References Cited

U.S. PATENT DOCUMENTS

| | | | | |
|---|---|---|---|---|
| 4,123,602 A | * | 10/1978 | Ukihashi | ............... C08F 210/02 522/185 |
| 5,575,968 A | | 11/1996 | Seo et al. | |
| 5,707,478 A | | 1/1998 | Fujii et al. | |
| 2002/0098371 A1 | | 7/2002 | Higuchi et al. | |
| 2002/0128412 A1 | | 9/2002 | Kitahara et al. | |

FOREIGN PATENT DOCUMENTS

| | | | |
|---|---|---|---|
| EP | 1452310 A1 | 9/2004 | |
| JP | 61-027231 A | 2/1986 | |
| JP | 11-106588 A | 4/1999 | |
| JP | 2001-206913 A | 7/2001 | |
| JP | 2002-226611 A | 8/2002 | |
| JP | 2006-111885 A | 4/2006 | |
| JP | WO 2012090674 | * 7/2012 | ............... C08K 9/02 |
| JP | 2013-237730 A | 11/2013 | |
| WO | 2012/090674 A1 | 7/2012 | |

OTHER PUBLICATIONS

Teng (Overview of the Development of the Fluoropolymer Industry, Appl. Sci. May 29, 2012, 2, 496-512).*
Communication dated Jul. 26, 2016, issued by the European Patent Office in corresponding European Application No. 13867553.3.
International Preliminary Report on Patentability dated Jul. 9, 2015, issued by the International Bureau in corresponding International Application No. PCT/JP2013/083969.
International Search Report for PCT/JP2013/083969 dated Mar. 25, 2014 [PCT/ISA/210].

* cited by examiner

*Primary Examiner* — Ling Choi
*Assistant Examiner* — Chun-Cheng Wang
(74) *Attorney, Agent, or Firm* — Sughrue Mion, PLLC

(57) ABSTRACT

The present invention aims to provide an ETFE film having excellent transparency and heat resistance and cost efficiency. The present invention relates to a film including a copolymer containing an ethylene unit, a tetrafluoroethylene unit, and a (fluoroalkyl)ethylene unit represented by Formula (1):

$$CH_2=CX-Rf \qquad (1)$$

wherein X represents H or F, and Rf represents a fluoroalkyl group having 2 or more carbon atoms, the copolymer containing the (fluoroalkyl)ethylene unit in an amount of 0.8 to 2.5 mol % relative to the amount of all the monomer units and containing the ethylene unit and the tetrafluoroethylene unit at a molar ratio of 30.0/70.0 to 50.0/50.0, the film having a crystallinity of 68% or less, the crystallinity being calculated on the basis of a diffraction intensity curve of the film resulting from X-ray diffraction measurement.

10 Claims, 1 Drawing Sheet

FLUORORESIN FILM HAVING EXCELLENT TRANSPARENCY

CROSS REFERENCE TO RELATED APPLICATIONS

This application is a National Stage of International Application No. PCT/JP2013/083969 filed Dec. 18, 2013, claiming priority based on Japanese Patent Application No. 2012-281413 filed Dec. 25, 2012, the contents of all of which are incorporated herein by reference in their entirety.

TECHNICAL FIELD

The present invention relates to a fluororesin film having excellent transparency.

BACKGROUND ART

Since ethylene/tetrafluoroethylene copolymers (ETFE) are excellent in heat resistance and weather resistance and lighter than glass, the use of an ETFE film on the surface of a solar battery, in replacement of glass, is now considered.

An ETFE film, however, problematically has insufficient transparency in comparison with glass. Moreover, if an ETFE film fails to be cooled in such a manner that the temperature distribution of the film becomes uniform upon production thereof by melt molding, the cooled film problematically has poor transparency and has loosening or wrinkles.

Patent Literature 1 discloses a method for producing a fluororesin film wherein, upon production of a flat film by contacting a molten fluororesin extruded from a T-die with a cooling roll and then rolling the cooled and solidified resin up, the cooling roll is set to have a surface temperature of 80° C. to 140° C. and hot air at 50° C. to 160° C. is blown to the film on the cooling roll, for the purpose of producing a fluororesin film excellent in flatness and optical properties such as transparency and gloss.

Patent Literature 2 discloses, as a tetrafluoroethylene-ethylene copolymer having a high light transmittance and low haze, a tetrafluoroethylene-ethylene copolymer wherein the copolymer having a ratio of (polymerization unit derived from tetrafluoroethylene)/(polymerization unit derived from ethylene) of 30/70 to 70/30 (molar ratio) further contains 1 to 10 (mol %) of a polymerization unit derived from vinyl ether represented by $CF_2=CF-O-R$ (1) (in the formula, R represents C3-C12 alkyl group optionally containing 1 to 3 ether oxygen atoms), is crystalline, and has a volume flow rate of 1 to 1000 mm$^3$/sec.

Patent Literature 3 discloses a biaxially stretched film such as an ethylene-tetrafluoroethylene-based copolymer film having significantly improved light transmittance.

CITATION LIST

Patent Literature

Patent Literature 1: JP-A 61-27231
Patent Literature 2: JP-A 2001-206913
Patent Literature 3: JP-A 2002-226611

SUMMARY OF INVENTION

Technical Problem

Since the power generation efficiency of a solar battery is poor if the sunlight transmittance is low, an ETFE film is desired to have better transparency than conventional ETFE films, be cost effective, and have excellent heat resistance.

The present invention devised in consideration of the state of the art aims to provide an ETFE film having excellent transparency and heat resistance and cost efficiency.

Solution to Problem

The present inventors found that production of a film by a novel production method using a copolymer having specific composition can lower the crystallinity of the film, and also found that a film having a crystallinity of 68% or less, among films having low crystallinity, has a significantly high light transmittance and a low haze value, thereby completing the present invention. Moreover, the present inventors found that a film having a crystallinity of 67% or less has further excellent transparency.

Specifically, the present invention relates to a film including a copolymer, the copolymer containing an ethylene unit, a tetrafluoroethylene unit, and a (fluoroalkyl)ethylene unit represented by Formula (1):

$$CH_2=CX-Rf \qquad (1)$$

wherein X represents H or F, and Rf represents a fluoroalkyl group having 2 or more carbon atoms, the copolymer containing the (fluoroalkyl)ethylene unit in an amount of 0.8 to 2.5 mol % relative to the amount of all the monomer units and containing the ethylene unit and the tetrafluoroethylene unit at a molar ratio of 30.0/70.0 to 50.0/50.0, the film having a crystallinity of 68% or less, the crystallinity being calculated by the following equation on the basis of a diffraction intensity curve of the film resulting from X-ray diffraction measurement:

$$\text{Crystallinity }(\%)=(S_{19}+S_{20})/(S_{17}+S_{19}+S_{20})\times 100$$

wherein $S_{20}$ represents a peak area around $2\theta=20°$,
$S_{17}$ represents a peak area around $2\theta=17°$, and
$S_{19}$ represents a peak area around $2\theta=19°$.

The film of the present invention preferably has a peak area ratio around $2\theta=20°$ calculated by the following equation of 10.0% or less:

$$\text{Peak area ratio }(\%)=S_{20}/(S_{19}+S_{20})\times 100.$$

The film of the present invention preferably has a half-width of a peak around $2\theta=19°$ of 3.0 or less.

The copolymer preferably has a melt flow rate of 40 (g/10 min) or less.

The film of the present invention preferably has a transmittance of light having a wavelength of 300 to 1100 nm of 75% or more.

The film of the present invention preferably has an arithmetic average inclination of 0.2° or less.

The present invention also relates to a solar battery including the film.

The present invention also relates to a method for producing the film, the method including the steps of melting a copolymer by heating to a melting point or higher, molding the molten copolymer into a film, rapidly cooling the film by contacting the film maintained to have a temperature not lower than the crystallization temperature of the copolymer, with a cooling roll set to have a temperature not exceeding a temperature that is higher than the glass transition temperature of the film by 10° C., and collecting the rapidly cooled film.

In the method for producing the film, a method of contacting the film with the cooling roll is preferably a method of charging the cooling roll with static electricity or a method of using a pressing roll to press the film to the cooling roll.

In the method for producing the film, the melting step and the molding step are preferably performed using an extruder equipped with a die, the die having an outlet set at a distance of 50 mm or less from a contact point of the film with the cooling roll.

Advantageous Effects of Invention

The film of the present invention has excellent transparency and heat resistance and is cost effective. The solar battery of the present invention including the film has high power generation efficiency, is capable of continuing power generation for a long period of time even under a high-temperature environment, and is cost effective.

DESCRIPTION OF EMBODIMENTS

Figure 1:
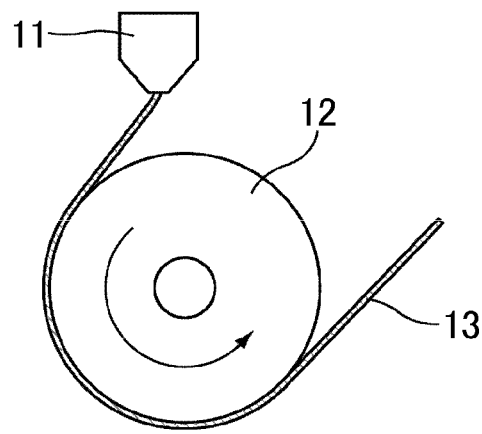
FIG. 1 is a schematic view illustrating a production method of a film.

The present invention is specifically described in the following.

The film of the present invention has a crystallinity of 68% or less, the crystallinity being calculated by the following equation on the basis of a diffraction intensity curve of the film resulting from X-ray diffraction measurement:

Crystallinity (%)=$(S_{19}+S_{20})/(S_{17}+S_{19}+S_{20})\times 100$ wherein $S_{20}$ represents a peak area around $2\theta=20°$,
$S_{17}$ represents a peak area around $2\theta=17°$, and
$S_{19}$ represents a peak area around $2\theta=19°$.

The X-ray diffraction measurement is performed using a powder X-ray diffraction device on a sample that is cut out from a film, attached on a quartz plate, and immobilized on a sample table. The resulting diffraction intensity curve is subjected to peak analysis by the peak separation method using analysis software. On the basis of the diffraction intensity curve obtained by the peak separation method, the crystallinity is calculated using the above equation.
Measurement method: $2\theta/\theta$ method
X-ray intensity: 40 kv, 120 mA
X-ray source: CuKα ray
Analysis software: JADE 6.0 available from Rigaku Corporation
Measurement temperature: Room temperature The crystallinity is preferably 67% or less in terms of transparency of the film.

It is presumed that the peak observed around $2\theta=20°$ is a peak derived from the (200) plane, the peak observed around $2\theta=19°$ is a peak derived from the (120) plane, and the peak observed around $S_{17}$: $2\theta=17°$ is a peak due to diffraction from an amorphous region of the sample.

The peak around $2\theta=20°$ is often observed at $2\theta=20°\pm 0.4$, and the peak around $2\theta=19°$ is often observed at $2\theta=19°\pm 0.4$.

Low crystallinity of the film can be achieved by devising the composition and a special molding method of copolymers included in the film. A description is later given on the composition and the molding method of copolymers.

The film of the present invention preferably has a peak area ratio around $2\theta=20°$ calculated by the following equation of 10.0% or less:

Peak area ratio (%)=$S_{20}/(S_{19}+S_{20})\times 100$.

When the peak area ratio around $2\theta=20°$ is 10.0% or less, the film can have a high light transmittance and a low haze value. The peak area ratio around $2\theta=20°$ is more preferably 4.0% or less. The lower limit of the peak area ratio may be 0%.

The film of the present invention preferably has a half-width of the peak around $2\theta=19°$ of 3.0 or less. When the peak around $2\theta=19°$ has a half-width of 3.0 or less, the film can have a high light transmittance. The half-width of the peak is more preferably 2.0 or less, and is preferably 0.5 or more.

The film of the present invention includes a copolymer containing an ethylene unit, a tetrafluoroethylene unit, and a (fluoroalkyl)ethylene unit represented by Formula (1):

$CH_2=CX-Rf$      (1)

wherein X represents H or F, and Rf represents a fluoroalkyl group having 2 or more carbon atoms.

Rf in Formula (1) represents a fluoroalkyl group having 2 or more carbon atoms. Since the film of the present invention includes a copolymer containing a monomer unit that has a fluoroalkyl group having 2 or more carbon atoms, the film has high transparency and excellent heat resistance. The fluoroalkyl group may be linear or branched. Rf preferably represents a fluoroalkyl group having 2 to 10 carbon atoms, and more preferably represents a fluoroalkyl group having 2 to 6 carbon atoms.

Examples of the monomers represented by the formula (1) include $CH_2=CF(CF_2)_2F$, $CH_2=CF(CF_2)_3F$, $CH_2=CF(CF_2)_4F$, $CH_2=CF(CF_2)_2H$, $CH_2=CF(CF_2)_3H$, $CH_2=CF(CF_2)_4H$, $CH_2=CH(CF_2)_2F$, $CH_2=CH(CF_2)_3F$, $CH_2=CH(CF_2)_4F$, $CH_2=CH(CF_2)_6F$, $CH_2=CH(CF_2)_2H$, $CH_2=CH(CF_2)_3H$, and $CH_2=CH(CF_2)_4H$. In terms of excellent transparency and heat resistance, particularly preferred is at least one selected from the group consisting of $CH_2=CH(CF_2)_6F$, $CH_2=CF(CF_2)_3H$, and $CH_2=CH(CF_2)_4F$.

The copolymer contains 0.8 to 2.5 mol % of the (fluoroalkyl)ethylene unit represented by the formula (1) relative to the amount of all the monomer units. Including the copolymer containing the (fluoroalkyl)ethylene unit represented by the formula (1) in an amount within the range mentioned above, the film of the present invention has high transparency and excellent heat resistance. The amount of the (fluoroalkyl)ethylene unit represented by the formula (1) is preferably 1.0 to 2.0 mol % relative to the amount of all the monomer units.

In the copolymer, the molar ratio of the ethylene unit to the tetrafluoroethylene unit is 30.0/70.0 to 50.0/50.0. Including the copolymer having a molar ratio of the ethylene unit to the tetrafluoroethylene unit within the range mentioned above, the film of the present invention has high transparency and excellent heat resistance. The molar ratio of the ethylene unit to the tetrafluoroethylene unit is preferably 33.0/67.0 to 48.0/52.0, and more preferably 35.0/65.0 to 44.0/56.0.

Here, the amount of each monomer unit is a value obtained by $^{19}$F-NMR analysis.

The copolymer may contain a fourth monomer unit different from the ethylene unit, the tetrafluoroethylene unit, and the (fluoroalkyl)ethylene unit. Examples of the fourth monomer include vinylidene fluoride, chlorotrifluoroethylene, vinyl fluoride, hexafluoropropylene, hexafluoroisobutene, and perfluoro (alkyl vinyl ether) represented by $CF_2$=CF—$ORf^1$ (in the formula, $Rf^1$ represents a C1-C8 perfluoroalkyl group), and alkyl perfluoro vinyl ether derivatives represented by $CF_2$=CF—$OCH_2$—$Rf^2$ (in the formula, $Rf^2$ represents a C1-C5 perfluoroalkyl group). In terms of the heat resistance, transparency, and cost, the copolymer contains a fourth monomer in an amount of preferably 0 to 2 mol % and more preferably 0 to 0.5 mol %. Still more preferably, the copolymer contains substantially no fourth monomer.

The copolymer has a glass transition temperature of preferably 50° C. to 120° C. and more preferably 60° C. to 110° C. because such a copolymer has excellent heat resistance and moldability. The glass transition temperature can be determined, for example, as follows. The temperature dependence of tan δ is measured from −50° C. to 150° C. under the conditions of the frequency of 1 Hz and the rate of temperature rise of 5° C./min using dynamic discoelasticity measuring device (Advanced Rheometric Expansion System, ARES, available from Rheometric Scientific, Inc.) in a torsional mode (using Torsion Rectangular Kit). The peak temperature of the resulting tan δ curve corresponds to the glass transition temperature.

The copolymer has a melting point of preferably 170° C. to 280° C. and more preferably 190° C. to 270° C. because such a copolymer has excellent heat resistance and moldability. The melting point can be determined as a temperature corresponding to a local maximum value on a heat of fusion curve that is obtained by increasing the temperature of the copolymer at a rate of temperature rise of 10° C./min using a DSC device (product of Seiko Instruments Inc.).

The copolymer has a crystallization temperature of preferably 160° C. to 270° C. and more preferably 180° C. to 260° C. because such a copolymer has excellent heat resistance and transparency.

The crystallization temperature can be determined as a temperature corresponding to a local minimum value on a heat of fusion curve that is obtained by lowering the temperature of the copolymer at a rate of temperature decrease of 10° C./min using a DSC device (product of Seiko Instruments Inc.).

The copolymer preferably has a melt flow rate [MFR] of 0.5 to 100 g/10 min, and more preferably 40 (g/10 min) or less and 4.0 g/10 min or more. The MFR can be determined by measuring the weight (g) of the polymer flowing out from a nozzle having a diameter of 2 mm and a length of 8 mm in a unit time (10 minutes) at 297° C. under a load of 5 kg using a melt indexer (product of TOYO SEIKI SEISAKUSHO, LTD.).

The copolymer can be produced by a known polymerization method such as suspension polymerization, emulsion polymerization, bulk polymerization, or solution polymerization.

The film of the present invention preferably has a transmittance of light having a wavelength of 300 to 1100 nm of 75% or more. In measurement of the light transmittance, a film for measurement having a thickness of 50 μm is prepared and a spectrophotometer U-4000 (product of Hitachi, Ltd.) is used. The light transmittance as used herein refers to a minimum value of the light transmittance values at individual wavelengths in a measuring range of 300 to 1100 nm.

The film of the present invention has a haze value of 2.5 or less. In the measurement of the haze value, a film for measurement having a thickness of 50 μm is prepared and a HAZE-GARD II available from TOYO SEIKI SEISAKUSHO, LTD. is used. The lower limit of the haze value is not particularly limited, and may be set to 0.1.

The film of the present invention has an arithmetic average inclination of preferably 0.2° or less. The arithmetic average inclination can be determined as follows. A film for measurement having a thickness of 50 μm is prepared, and the surface roughness thereof is measured using a surface roughness meter (SURFTEST SV-600, product of Mitsutoyo Corporation). After extraction of the waviness excluding the roughness equal to or less than the arithmetic average roughness, the arithmetic average inclination can be calculated. The lower limit of the arithmetic average inclination is not particularly limited, and may be set to 0.01°.

The film of the present invention after being heated to the softening point or higher and then cooled preferably still has an arithmetic average inclination of 0.2° or less. If the film produced by biaxial stretching is heated to the softening point or higher under the condition that the film is not externally stretched, the molecules immobilized by stretching resume to the original state before the stretching. In such a case, the film is rapidly shrunk to have wrinkles. The reason for this is that the copolymer is a non-polar polymer. Since the film of the present invention is produced by the production method described later, the film has a non-oriented crystalline state and is not to be shrunk even when heated to the softening point or higher. If the film is cooled by hot wind or the like at a temperature not exceeding the crystallization temperature of the copolymer, the surface temperature of the film becomes equal to or lower than the crystallization temperature of the copolymer, adversely affecting the transparency of the film.

The film of the present invention has a thickness of preferably 10 to 100 μm and more preferably 15 to 50 μm. If the film is too thick, the transparency may be poor, whereas if the film is too thin, the mechanical strength may be poor.

The film of the present invention may contain ingredients such as an antioxidant and a UV absorber.

Next, a description is given on the production method of the film of the present invention.

The film of the present invention can be favorably produced by a method including the steps of melting a copolymer by heating to a melting point or higher, molding the molten copolymer into a film, rapidly cooling the film by contacting the film maintained to have a temperature not lower than the crystallization temperature of the copolymer, with a cooling roll set to have a temperature not exceeding a temperature that is higher than the glass transition temperature of the film by 10° C., and collecting the rapidly cooled film.

The melting step and the molding step may be carried out by known methods. For example, an extruder equipped with a die may be used. The heating temperature is higher than the melting point of the copolymer preferably by 60° C. or higher and more preferably by 80° C. or higher.

The film resulting from the molding step is kept at a temperature higher than the crystallization temperature of the copolymer by 20° C. or more while the film is moved to the cooling step with no resting time between the steps.

The surface temperature of the film immediately before the contact with the cooling roll is higher than the crystallization temperature by preferably 20° C., more preferably by 40° C. or higher, and still more preferably by 70° C. or higher.

For the purpose of keeping the temperature of the film resulting from the molding step high, the distance (air gap) from the outlet of the die to the contact point where the film and the cooling roll becomes in contact with each other is preferably short. Specifically, the air gap is preferably 50 mm or shorter, and if the air gap is 15 mm or shorter, the result is especially favorable.

In the cooling step, the high-temperature film resulting from the molding step is rapidly cooled. The surface temperature of the cooling roll used for rapid cooling is preferably set to a temperature not exceeding a temperature that is higher than the glass transition temperature of the film by 10° C., and is more preferably set to a temperature not exceeding the glass transition temperature of the film. If the temperature of the cooling roll exceeds the temperature that is higher than the glass transition temperature by 10° C., the crystallinity of the film becomes higher, adversely affecting the transparency. The surface temperature of the cooling roll is preferably 20° C. or higher because the film is less likely to have wrinkles in such a case.

In order to achieve high transparency, the surface temperature of the film and the surface temperature of the cooling roll immediately before the contact of the film with the cooling roll are significantly important. The difference between the surface temperature of the film and the surface temperature of the cooling roll immediately before the contact of the film with the cooling roll is preferably 200° C. or higher and more preferably 220° C. or higher, and preferably 340° C. or lower and more preferably 320° C. or lower. If the temperature difference is too small, the resulting film may not be sufficiently transparent, whereas if the temperature difference is too large, the film is likely to have wrinkles. When the wrinkles are formed, the film may not be sufficiently transparent.

If the film has a part not sufficiently contacting the cooling roll upon contact of the film with the cooling roll, the part cannot be cooled at an enough cooling speed and may possibly be opaque. Moreover, variation in the cooling speed may cause formation of wrinkles in the film. Accordingly, the cooling roll is preferably equipped with a means for increasing the degree of contact between the film and the roll. Exemplary methods include a method of pressing the film to the cooling roll by a pressing roll provided to face the cooling roll through the film, a method of charging the cooling roll with static electricity for firm contact of the film with the cooling roll, and a method of drawing air between the cooling roll and the film for firm contact of the film with the cooling roll. In a method of blowing hot air to the film for firm contact of the film with the cooling roll, the film is not in contact with the roll sufficiently during the cooling, so that a sufficiently transparent film cannot be obtained.

From the standpoint of avoiding formation of wrinkles in the film, the method of firmly contacting the film with the cooling roll is preferably the method of charging the cooling roll with static electricity for firm contact of the film with the cooling roll or the method of pressing the film by the pressing roll for firm contact of the film with the cooling roll. In terms of the uniformity of the degree of contact of the film with the cooling roll, more preferred is the method of charging the cooling roll with static electricity.

The transparent film without wrinkles resulting from the cooling step is wound by a roll, for example, in the collecting step.

Figure 2:
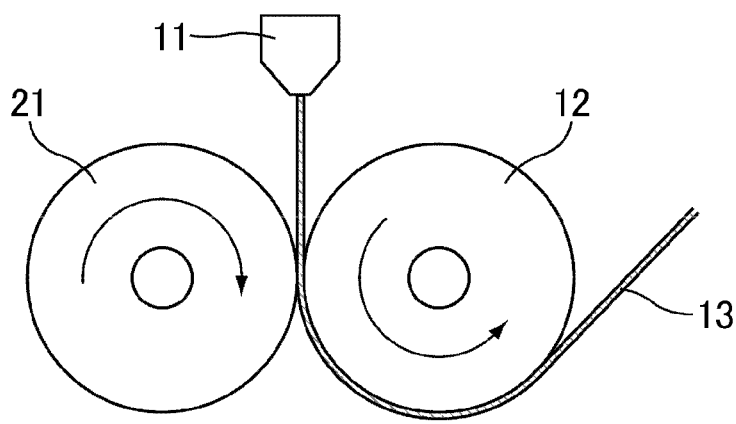
FIG. 2 is a schematic view illustrating a production method of a film.
Figure 3:
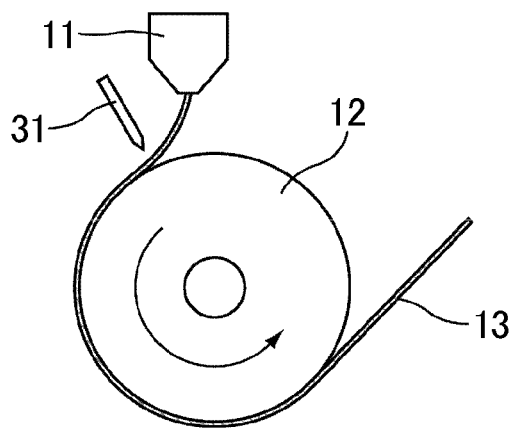
FIG. 3 is a schematic view illustrating a production method of a film.

FIG. 1 shows one example of the production method of the film. As illustrated in FIG. 1, a molten copolymer is extruded in a shape of a film from die 11 provided in an extruder (not illustrated), and extruded film 13 comes in contact with cooling roll 12, thereby being cooled. The cooled film 13 is passed to a collecting roll (not illustrated) and wound by a take-up roll (not illustrated). As illustrated in FIG. 2, film 13 may be made in contact with cooling roll 12 firmly by pressing roll 21. In such a method, since the degree of contact between film 13 and cooling roll 12 increases, the resulting film has high transparency and has no wrinkles. As illustrated in FIG. 3, film 13 may be made in contact with cooling roll 12 firmly by electrostatic pinning 31. The electrostatic pinning is provided with electrodes (not illustrated), and application of an voltage to the electrodes generates static electricity, thereby firmly contacting film 13 with cooling roll 12. Two electrodes may be provided in such a manner as to present at both ends of the film.

Since being transparent and having high heat resistance, the film of the present invention can be suitably used for a solar battery. The present invention also encompasses a solar battery including the film of the present invention. The solar battery of the present invention preferably has the film of the present invention on a plane where the sunlight is incident. Since the film of the present invention also has weather resistance, the film is more preferably provided on an outermost surface of the plane where the sunlight is incident.

The solar battery of the present invention preferably includes a solar battery cell, a sealing material layer with the solar battery cell sealed inside, and the film of the present invention provided on either or both faces of the sealing material layer. The solar battery of the present invention may include another layer between the film of the present invention and the sealing material layer.

The film of the present invention having excellent transparency and heat resistance and cost efficiency is suitably used in a wide range of fields, such as film materials for lamination, film materials for adhesion tapes, agricultural coating materials for tunnel houses and pipe houses, electric insulating films, heavy duty packaging films, and films for solar batteries, especially, laminated films with an EVA layer for solar batteries.

EXAMPLES

Next, the present invention is described with reference to, but not limited to, examples.

Individual numerical values in the examples were measured by the following methods.

(Melt Flow Rate)

The melt flow rate was determined by measuring the weight (g) of a polymer flowing out from a nozzle having a diameter of 2 mm and a length of 8 mm in a unit time (10 minutes) at 297° C. and under a load of 5 kg using a melt indexer (product of TOYO SEIKI SEISAKUSHO, LTD.).

(Amount of Monomer Unit)

The amounts of monomer units were determined by $^{19}$F-NMR analysis.

(Glass Transition Temperature)

The copolymer included in the film of the present invention were compression-molded to give a test sample having a length of 45 mm, a width of 12.5 mm, and a thickness of 1.3 mm. Using the test sample, the temperature dependence of tan δ was measured from −50° C. to 150° C. under the conditions of the frequency of 1 Hz and a rate of temperature rise of 5° C./min using dynamic discoelasticity measuring device (Advanced Rheometric Expansion System, ARES, available from Rheometric Scientific, Inc.) in a torsional mode (using Torsion Rectangular Kit). The peak temperature of the resulting tan δ curve corresponds to the glass transition temperature.

(Crystallization Temperature)

The crystallization temperature was obtained as a temperature corresponding to the peak of an exothermic curve in the heat of fusion curve formed when the temperature was lowered at a rate of 10° C./min using a DSC device (product of SII Nano Technology Inc.).

(Melting Point)

The melting point was obtained as a temperature corresponding to the peak of a heat absorption curve of the melting heat curve obtained by increasing the temperature of the copolymer at a rate of 10° C./min using a DSC device (product of SII Nano Technology Inc.).

(X-Ray Diffraction Measurement)

The crystallinity can be determined from the integrated intensity of the diffraction peaks obtained by the X-ray diffraction method.

A sample was attached to a quartz plate for samples and immobilized on a sample table. The X-ray diffraction measurement was performed thereon using a powder X-ray diffraction device. The resulting diffraction intensity curve was subjected to curve fitting using analysis software in such a manner that the difference between the fitting curve and the real curve was set to 10% or less. A peak separation method was employed for peak analysis. The peak position of the amorphous part was set to 2θ=17.268° and two crystalline peaks were automatically detected. Two crystalline peaks were provided, and the area ratio thereof was determined.
Shape of sample: a 1.5-cm-square film having a thickness of 50 μm
Measuring device: Ultima III available from Rigaku Corporation
Measuring method: 2θ/θ method
Measuring range: 2θ=5° to 40°
X-ray strength: 40 kv, 120 mA
X-ray source: CuKα ray
Analysis software: JADE 6.0 available from Rigaku Corporation
Measuring temperature: Room temperature (Crystallinity)

The crystallinity was calculated by the following equation based on the integrated intensity of the diffraction intensity curve resulting from the X-ray diffraction measurement:

$$\text{Crystallinity (\%)}=(S_{19}+S_{20})/(S_{17}+S_{19}+S_{20})\times 100.$$

$S_{20}$: Peak area around 2θ=20°
$S_{17}$: Peak area around 2θ=17°
$S_{19}$: Peak area around 2θ=19°

(Peak Area Ratio)

The peak area ratio around 2θ=20° was calculated by the following equation based on the diffraction intensity curve resulting from the X-ray diffraction measurement:

$$\text{Peak area ratio (\%)}=S_{20}/(S_{19}+S_{20})\times 100.$$

(Half-Width of Peak)

A baseline was drawn on the diffraction intensity curve resulting from the X-ray diffraction measurement, and the width of the diffraction intensity curve at an intensity of one-half of the peak intensity was measured, thereby obtaining the half-width of the peak around 2θ=19°.

(Light Transmittance)

A sample was cut out from a part of the film where the thickness was 50 μm and placed on a sample table. The light transmittance of the sample was measured using a spectrophotometer U-4000 (product of Hitachi, Ltd.). Within a measuring wavelength range of 300 to 1100 nm, the transmittance of light was smallest at a wavelength of 300 nm. Accordingly, the light transmittance of the film was evaluated by measuring the transmittance of light having a wavelength of 300 nm.

(Haze Value)

The haze value was measured using a HAZE-GARD II available from TOYO SEIKI SEISAKUSHO, LTD.

(Arithmetic Average Inclination)

The arithmetic average inclination was measured using a SURFTEST SV-600 available from Mitsutoyo Corporation.

(Surface Temperature of Film Immediately Before Contact with Cooling Roll)

The surface temperature of the film immediately before the contact with the cooling roll was measured using an infrared radiation thermometer.

Example 1

An ETFE resin (Neofreon ETFE EP-526 available from DAIKIN INDUSTRIES, LTD., melt flow rate: 15 g/10 min, molar ratio of copolymer: tetrafluoroethylene/ethylene/perfluorohexyl ethylene=56.3/42.4/1.3, glass transition temperature: 92° C., crystallization temperature: 241° C., melting point: 253° C.) was molten and extruded at 340° C. from a T-die having a width of 1600 mm in a T-die film-forming machine (product of Ikegai Corp.) having an aperture of 90 mmφ. Then, the film was made in contact with a cooling roll set at 80° C. and gave a film having a thickness of 40 to 60 μm under the film-forming conditions of a collecting rate of 5 m/min and an air gap of 15 mm. Upon contact of the film with a cooling roll, both ends of the film was pressed to the roll by an electrostatic pinning to which a 10 kV voltage was applied, so as to be prevented from shrinking. In this manner, the roll and the film was made in contact with each other firmly so that no air entered therebetween, thereby avoiding formation of wrinkles due to the cooling roll.

The electrostatic pinning is a device for more stably contacting a molten body extruded from a T-die in the film-forming step by the melt extrusion method with the cooling roll firmly by the electrostatic adhesion method (in which application of a high voltage to a pinning electrode enables adhesion of the molten body between the cooling roll to the roll surface).

Table 1 shows the measurement results of the crystallinity and light transmittance and the like of the resulting film. All the measured properties were favorable, and the film has a high quality.

Example 2

A film was produced in the same manner as in Example 1, except that the surface temperature of the cooling roll was changed to 100° C. Table 1 shows the measurement results of the crystallinity and light transmittance and the like of the resulting film.

Example 3

A film was produced in the same manner as in Example 1, except that an ETFE resin (melt flow rate: 12 g/10 min, molar ratio of copolymer: tetrafluoroethylene/ethylene/perfluorobutyl ethylene=55.0/43.6/1.4, glass transition temperature: 94° C., crystallization temperature: 243° C., melting point: 257° C.) was used. Table 1 shows the measurement results of the crystallinity and light transmittance and the like of the film.

Example 4

A film was produced in the same manner as in Example 1, except that the die temperature was changed to 320° C. Table 1 shows the crystallinity and light transmittance of the resulting film.

Example 5

A film was produced in the same manner as in Example 1, except that the surface temperature of the cooling roll was changed to 20° C. Table 1 shows the measurement results of the crystallinity and light transmittance and the like of the resulting film.

Example 6

A film was produced in the same manner as in Example 1, except that a pressing roll was used instead of the electrostatic pinning. Table 1 shows measurement results of the crystallinity and light transmittance and the like of the resulting film.

Example 7

A film was produced in the same manner as in Example 1, except that the air gap was changed to 50 mm. Table 1 shows the measurement results of the crystallinity and light transmittance and the like of the resulting film.

Comparative Example 1

A film was produced in the same manner as in Example 1, except that the surface temperature of the cooling roll was changed to 150° C. Table 1 shows the measurement results of the crystallinity and light transmittance and the like of the resulting film.

Comparative Example 2

A film was produced in the same manner as in Example 1, except that the air gap was changed to 150 mm. Table 1 shows the measurement results of the crystallinity and light transmittance and the like of the resulting film.

Comparative Example 3

A film was produced in the same manner as in Example 1, except that the electrostatic pinning was not used. Table 1 shows the measurement results of the crystallinity and light transmittance and the like of the resulting film.

Reference Example

A biaxially stretched film having a thickness of 40 to 60 μm and the film of Example 1 were heated at 200° C. (temperature equal to or higher than the softening point) for three hours. In comparison of the shrinkage, the former film was shrunk by −3.5% in both the machine direction (MD) and the transverse direction (TD). In contrast, in the case of the film of Example 1, the degree of shrinkage was −1% in the MD and −0.5% in the TD. In other words, the film of Example 1 had almost no shrinkage.

TABLE 1

| | | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|---|
| Film-forming conditions | Die temperature (° C.) | 340 | 340 | 340 | 320 | 340 | 340 | 340 | 340 | 340 | 340 |
| | Surface temperature of cooling roll (° C.) | 80 | 100 | 80 | 80 | 20 | 80 | 80 | 150 | 80 | 80 |
| | Collecting rate (m/min) | 5 | 5 | 5 | 5 | 5 | 5 | 5 | 5 | 5 | 5 |
| | Air gap (mm) | 15 | 15 | 15 | 15 | 15 | 15 | 50 | 15 | 150 | 15 |
| | Method for contact with cooling roll | Electrostatic pinning | Electrostatic pinning | Electrostatic pinning | Electrostatic pinning | Electrostatic pinning | Pressing roll | Electrostatic pinning | Electrostatic pinning | Electrostatic pinning | None |
| | Surface temperature of film immediately before contact with cooling roll (° C.) | 330 | 330 | 330 | 310 | 330 | 330 | 280 | 330 | 210 | 330 |
| Properties of film | Crystallinity (%) | 67 | 68 | 67 | 68 | 67 | 67 | 68 | 83 | 88 | 72 |
| | Peak area ratio (%) | 3.0 | 9.0 | 3.0 | 9.0 | 3.0 | 3.0 | 9.0 | 12.0 | 11.0 | 11.0 |
| | Half-width of peak | 1.6 | 2.0 | 1.6 | 2.0 | 1.6 | 1.6 | 2.0 | 2.4 | 2.1 | 2.0 |
| | Light transmittance (%) | 81 | 78 | 80 | 77 | 79 | 79 | 76 | 58 | 60 | 72 |
| | Haze value | 1.9 | 2.1 | 1.9 | 2.2 | 2.0 | 2.0 | 2.3 | 4.2 | 3.8 | 3.5 |
| | Arithmetic average inclination (°) | 0.188 | 0.167 | 0.189 | 0.190 | 0.195 | 0.196 | 0.180 | 0.144 | 0.229 | 0.476 |

REFERENCE SIGNS LIST

11: Die
12: Cooling roll
13: Film
21: Pressing roll
31: Electrostatic pinning

The invention claimed is:

1. A film comprising a copolymer, the copolymer containing an ethylene unit, a tetrafluoroethylene unit, and a (fluoroalkyl)ethylene unit represented by Formula (1):

$$CH_2=CX-Rf \quad (1)$$

wherein X represents H or F, and Rf represents a fluoroalkyl group having 2 or more carbon atoms,
the copolymer containing the (fluoroalkyl)ethylene unit in an amount of 0.8 to 2.5 mol % relative to the amount of all the monomer units and containing the ethylene unit and the tetrafluoroethylene unit at a molar ratio of 30.0/70.0 to 50.0/50.0,
the film having a crystallinity of 68% or less, the crystallinity being calculated by the following equation on the basis of a diffraction intensity curve of the film resulting from X-ray diffraction measurement:

$$\text{Crystallinity } (\%) = (S_{19}+S_{20})/(S_{17}+S_{19}+S_{20}) \times 100$$

wherein $S_{20}$ represents a peak area around $2\theta=20°$,
$S_{17}$ represents a peak area around $2\theta=17°$, and
$S_{19}$ represents a peak area around $2\theta=19°$.

2. The film according to claim 1,
wherein a peak area ratio around $2\theta=20°$ calculated by the following equation is 10.0% or less:

$$\text{Peak area ratio } (\%) = S_{20}/(S_{19}+S_{20}) \times 100.$$

3. The film according to claim 1,
wherein a half-width of the peak around $2\theta=19°$ is 3.0 or less.

4. The film according to claim 1,
wherein the copolymer has a melt flow rate of 40 (g/10 min) or less at 297° C.

5. The film according to claim 1,
wherein transmittance of light having a wavelength of 300 to 1100 nm is 75% or more.

6. The film according to claim 1,
wherein an arithmetic average inclination is 0.2° or less.

7. A solar battery including the film according to claim 1.

8. A method for producing a film comprising a copolymer, the copolymer containing an ethylene unit, a tetrafluoroethylene unit, and a (fluoroalkyl)ethylene unit represented by Formula (1):

$$CH_2=CX-Rf \quad (1)$$

wherein X represents H or F, and Rf represents a fluoroalkyl group having 2 or more carbon atoms,
the copolymer containing the (fluoroalkyl)ethylene unit in an amount of 0.8 to 2.5 mol % relative to the amount of all the monomer units and containing the ethylene unit and the tetrafluoroethylene unit at a molar ratio of 30.0/70.0 to 50.0/50.0,
the film having a crystallinity of 68% or less, the crystallinity being calculated by the following equation on the basis of a diffraction intensity curve of the film resulting from X-ray diffraction measurement:

$$\text{Crystallinity } (\%) = (S_{19}+S_{20})/(S_{17}+S_{19}+S_{20}) \times 100$$

wherein $S_{20}$ represents a peak area around $2\theta=20°$,
$S_{17}$ represents a peak area around $2\theta=17°$, and
$S_{19}$ represents a peak area around $2\theta=19°$,
the method comprising the steps of
melting the copolymer by heating to a melting point or higher,
molding the molten copolymer into a film,
rapidly cooling the film by contacting the film maintained at a temperature not lower than the crystallization temperature of the copolymer, with a cooling roll set to a temperature not exceeding a temperature that is higher than the glass transition temperature of the film by 10° C., and
collecting the rapidly cooled film.

9. The method according to claim 8,
wherein, a method of contacting the film with the cooling roll is a method of charging the cooling roll with static electricity for firm contact of the film with the cooling roll or a method of using a pressing roll to press the film to the cooling roll for firm contact of the film with the cooling roll.

10. The method according to claim 8,
wherein the melting and the molding are performed using an extruder equipped with a die, the die having an outlet set at a distance of 50 mm or less from a contact point of the film with the cooling roll.

* * * * *